(12) United States Patent
Kwong et al.

(10) Patent No.: US 6,462,957 B1
(45) Date of Patent: Oct. 8, 2002

(54) HIGH PERFORMANCE ORTHOGONAL INTERCONNECT ARCHITECTURE WITHOUT MIDPLANE

(75) Inventors: Herman Kwong, Kanata; Bao Chau L. Nguyen; Van C. Au, both of Ottawa; Paul A. Senyshyn, Nepean; Martin R. Handforth, Kanata; Rolf G. Meier, Carp; Delfin Y. Montuno; Ernst A. Munter, both of Kanata; Hasler R. Hayes, Munster Hamlet, all of (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/739,882

(22) Filed: Dec. 20, 2000

Related U.S. Application Data

(63) Continuation-in-part of application No. 09/660,196, filed on Sep. 12, 2000, which is a continuation-in-part of application No. 09/443,128, filed on Nov. 18, 1999, application No. 09/739,882, filed on Dec. 20, 2000.
(60) Provisional application No. 60/246,599, filed on Nov. 8, 2000.

(51) Int. Cl.[7] ............................. H05K 7/14; H05K 7/18
(52) U.S. Cl. ...................... 361/796; 361/749; 361/736; 361/803; 361/804; 361/777–780; 361/794; 174/261; 174/255
(58) Field of Search ................................ 361/735, 790, 361/736, 737, 752, 796, 749, 803, 784, 777, 778, 779, 780, 794; 174/261

(56) References Cited

U.S. PATENT DOCUMENTS

| | | | | |
|---|---|---|---|---|
| 4,109,298 A | * | 8/1978 | Hanni et al. | 361/412 |
| 5,958,030 A | * | 9/1999 | Kwa | 710/101 |
| 6,081,430 A | * | 6/2000 | La Rue | 361/788 |
| 6,163,464 A | * | 12/2000 | Ishibashi et al. | 361/788 |

\* cited by examiner

Primary Examiner—David Martin
Assistant Examiner—Thanh Y. Tran
(74) Attorney, Agent, or Firm—Hunton & Williams

(57) ABSTRACT

An improved electrical interconnection between a first circuit board and a second circuit board is provided. In one embodiment, the first circuit board has a substantially rigid circuit portion having a plurality of circuit layers, including a first signal layer, and a first interconnection portion, including the first signal layer, for mating with a second interconnection portion of the second circuit board. The first circuit board also includes a flexible portion, including the first signal layer, for connecting the substantially rigid circuit portion to the first interconnection portion. The flexible portion allows the first interconnection portion to be oriented substantially perpendicular to the substantially rigid circuit portion such that a mating of the first interconnection portion with the second interconnection portion results in a substantially orthogonal electrical interconnection arrangement between the first circuit board and the second circuit board.

22 Claims, 9 Drawing Sheets

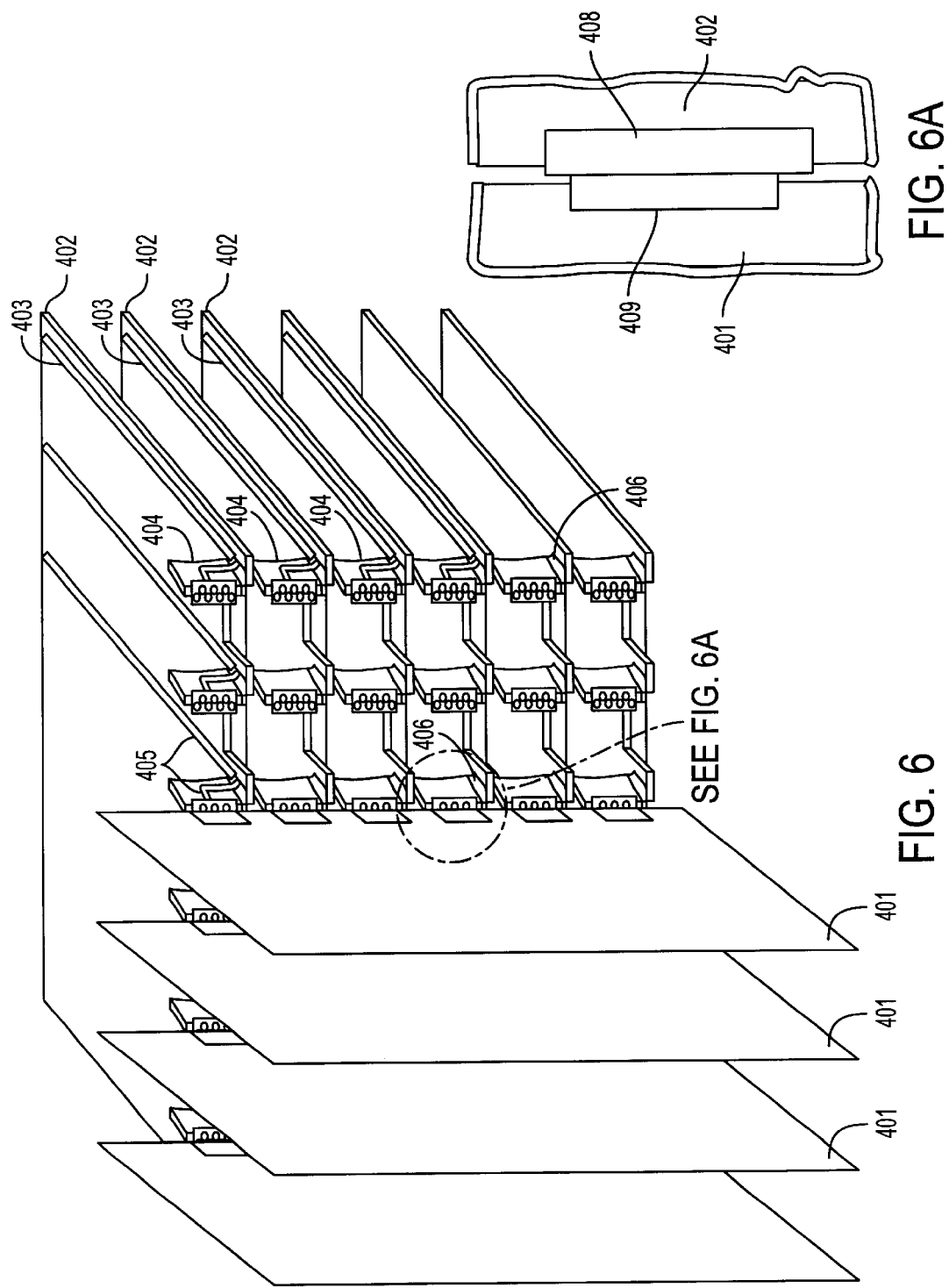

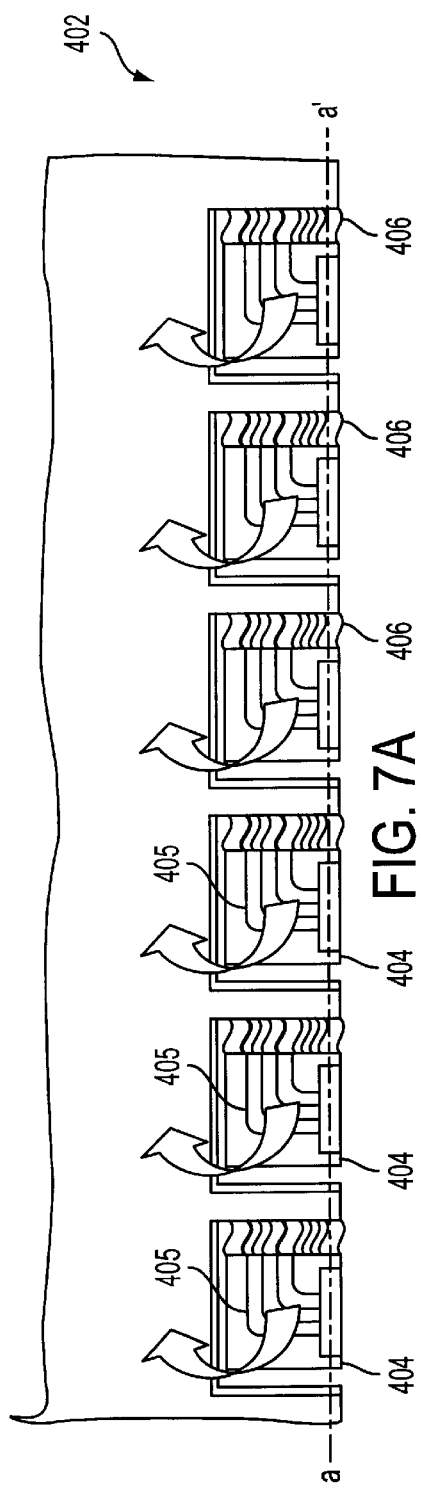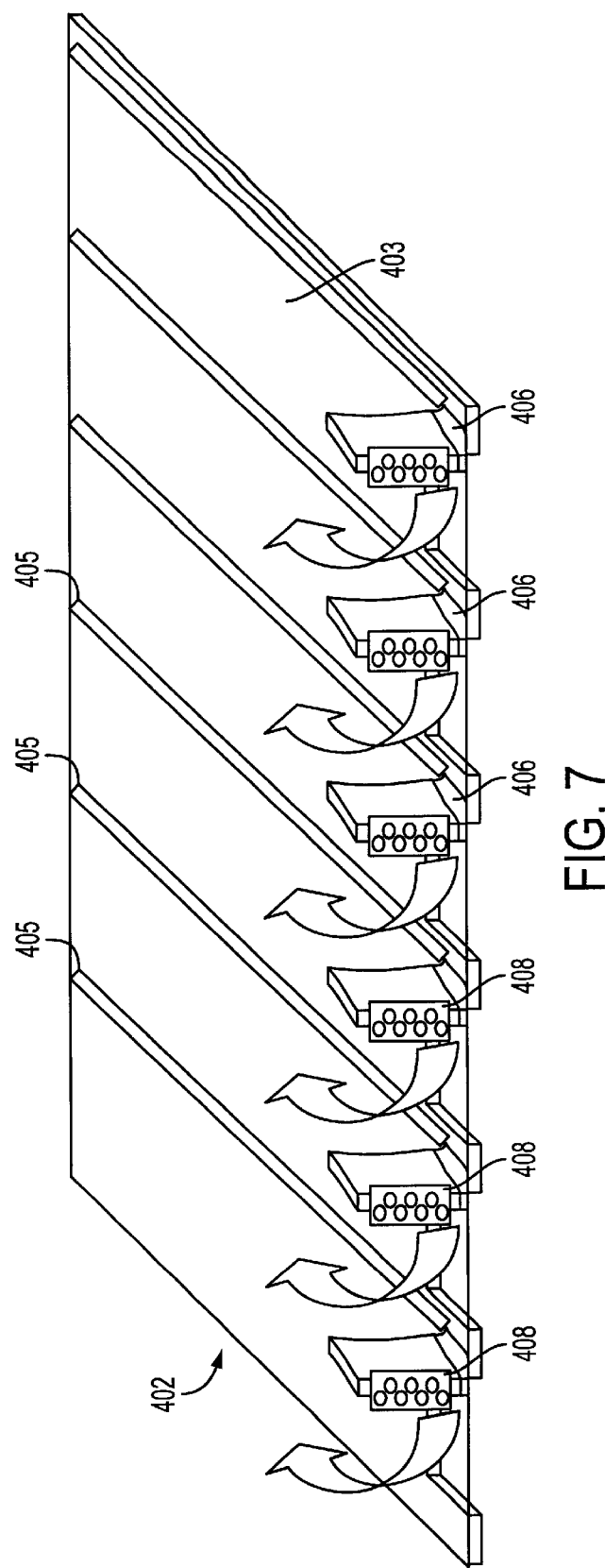

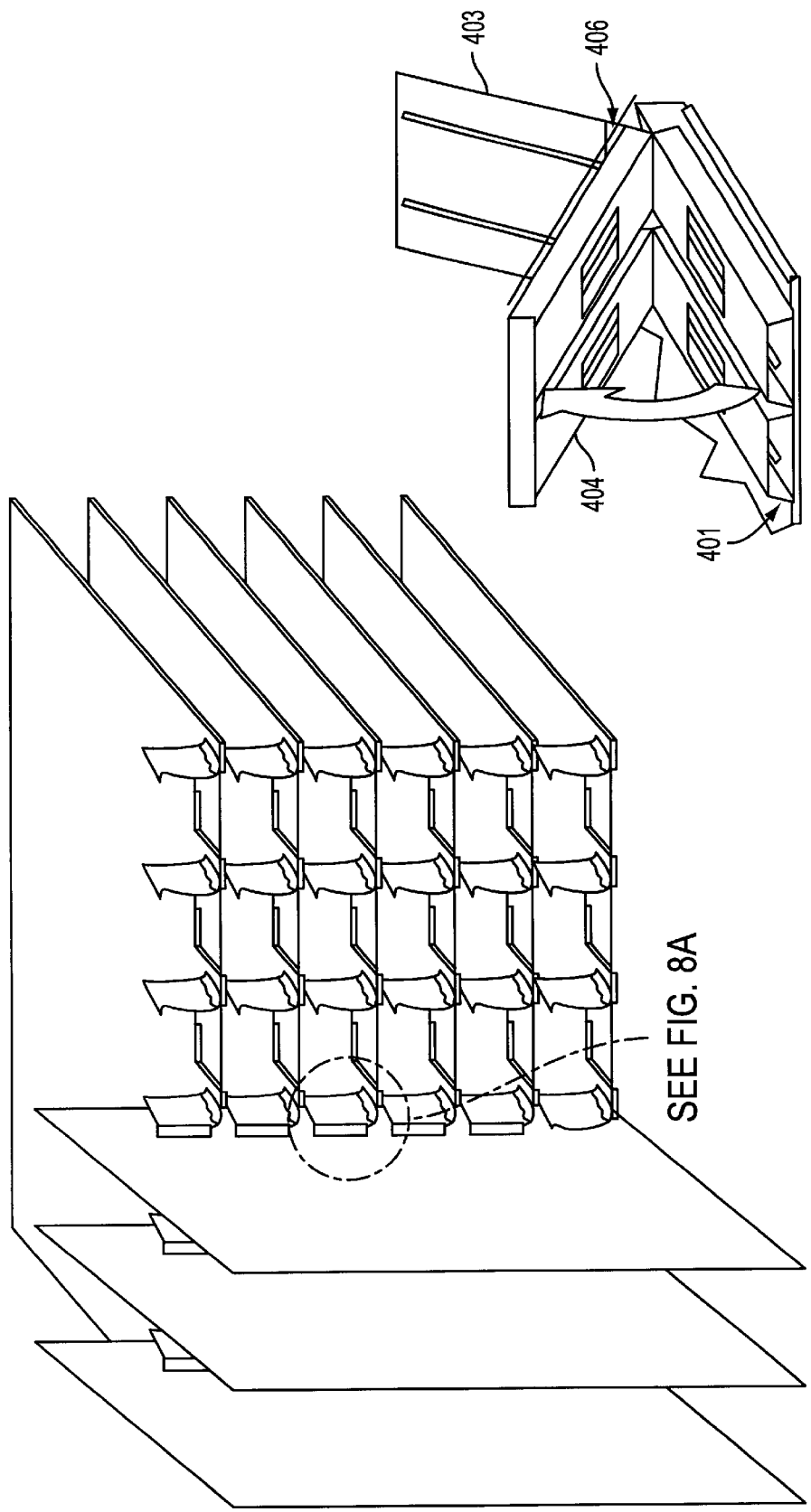

HIGH PERFORMANCE ORTHOGONAL INTERCONNECT ARCHITECTURE WITHOUT MIDPLANE

CROSS-REFERENCE TO RELATED APPLICATIONS

This patent application is a continuation-in-part of U.S. patent application Ser. No. 09/660,196, filed Sep. 12, 2000, which is a continuation-in-part of U.S. patent application Ser. No. 09/443,128, filed Nov. 18, 1999, both of which are hereby incorporated by reference herein in their entirety. This application also claims priority to U.S. Provisional Patent Application No. 60/246,599, filed Nov. 8, 2000.

FIELD OF THE INVENTION

The present invention relates generally to the making of electrical signal connections between circuit boards and, more particularly, to a technique for interconnecting a port card and a switch card without using a midplane.

BACKGROUND OF THE INVENTION

In many computer systems, electronic components are typically mounted on a plurality of circuit boards. These circuit boards, often referred to as port cards, are typically mounted on a switch card so as to allow electrical connections to be made between the electronic components mounted on the port cards. The mounting of the port cards on the switch card is typically accomplished through conventional pin-and-box connectors, and through the use of additional circuit boards (commonly referred to as midplanes) in instances where an orthogonal interconnection between switch and port cards is desired. However, there are intrinsic and mechanical related parasitics associated with these conventional methods. These parasitics put limits on maximum signal transmission bandwidth across the switch and port cards. In fact, the best connector that is presently known in the industry claims to be able to handle 5 Gb/s, which cannot meet the bandwidth demands associated with new telecommunication systems, which are on the order of 10 Gb/s.

There are also space concerns associated with the use of conventional pin-and-box board-to-board connectors. That is, conventional pin-and-box board-to-board connectors typically have bulky mechanical shrouds which take up valuable board and shelf space. Also, the use of midplanes in prior art interconnections prevents proper airflow over the port and switch cards.

In view of the foregoing, it would be desirable to provide an improved electrical interconnection between circuit boards which overcomes the above-described inadequacies and shortcomings. More particularly, it would be desirable to provide a technique for interconnecting a port card and a switch card without using a midplane, while eliminating problems associated with mechanical electrical connectors.

SUMMARY OF THE INVENTION

According to the present invention, an improved electrical interconnection between a first circuit board and a second circuit board is provided. In one embodiment, the first circuit board has a substantially rigid circuit portion having a plurality of circuit layers, including a first signal layer, and a first interconnection portion, including the first signal layer, for mating with a second interconnection portion of the second circuit board. The first circuit board also includes a flexible portion, including the first signal layer, for connecting the substantially rigid circuit portion to the first interconnection portion. The flexible portion allows the first interconnection portion to be oriented substantially perpendicular to the substantially rigid circuit portion such that a mating of the first interconnection portion with the second interconnection portion results in a substantially orthogonal electrical interconnection arrangement between the first circuit board and the second circuit board. In conventional architecture such orthogonal arrangement requires a midplane.

In accordance with further aspects of the present invention, the mating is accomplished through a direct electrical connection consisting of a male connector connected to the first interconnection portion and a female connector connected to the second interconnection portion for receiving the male connector, and vice-versa.

In accordance with further aspects of the present invention, the mating is accomplished through electromagnetic coupling.

In accordance with still further aspects of the present invention, at least one dielectric constant material is beneficially disposed between the first circuit board and the second circuit board in the area where the first opening and the second interconnection portion are aligned.

In accordance with still further aspects of the present invention, the first circuit board may be a switch card, and the second circuit board may be a port card.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2a is an expanded side view of a portion of the switch card/port card interface configuration shown in FIG. 2.

FIG. 2b is an end cross-sectional view of the portion of the switch card/port card interface configuration shown in FIG. 2a taken along line A—A of FIG. 2a.

FIG. 6 is a perspective view of a fourth embodiment of a switch card/port card interface configuration in accordance with the present invention.

FIG. 6a is an expanded side view of a portion of the switch card/port card interface configuration shown in FIG. 6.

FIG. 7 is a perspective view of the switch card of the switch card/port card interface configuration shown in FIG. 6.

FIG. 7a is a top view of the switch card shown in FIG. 7.

FIG. 8 is a perspective view of a fifth embodiment of a switch card/port card interface configuration in accordance with the present invention.

FIG. 8a is perspective view of the switch card/port card interface configuration shown in FIG. 8 with the entire port card rotated away from the switch card.

DETAILED DESCRIPTION OF EXEMPLARY EMBODIMENT(S)

Figure 1A:
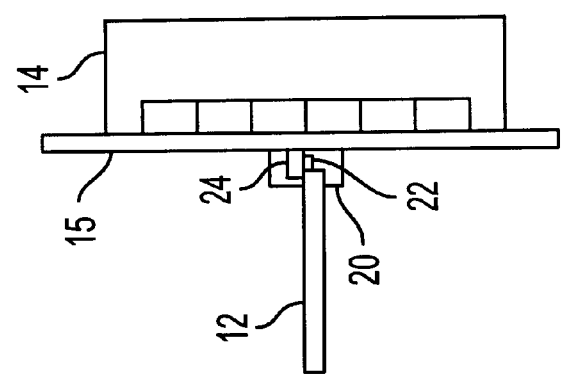
FIG. 1a is a side cross-sectional view of a portion of the conventional switch card/port card mounting configuration shown in FIG. 1.
Figure 1:
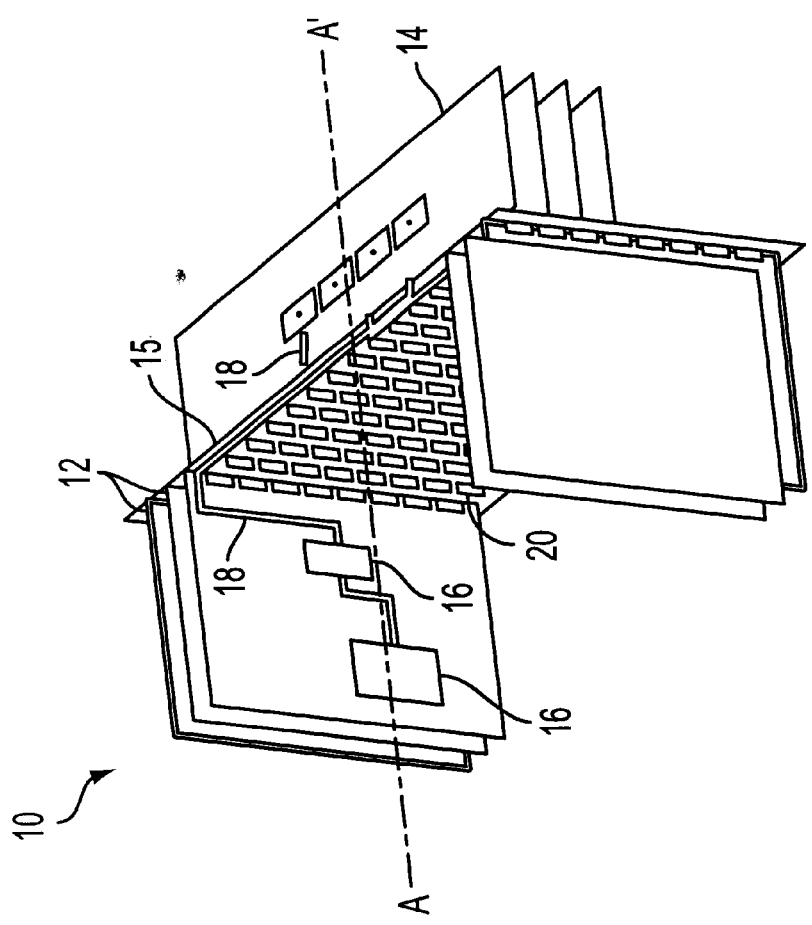
FIG. 1 is a perspective view of a conventional switch card/port card mounting configuration.

To illustrate the concept of the present invention it is first useful to show a conventional switch card/port card mounting configuration . Referring to FIG. 1, there is shown such a conventional switch card/port card mounting configuration 10, wherein a plurality of port cards 12 are shown mounted to a plurality of switch cards 14. Each port card 12 has electronic components 16 mounted thereon which are electrically connected to each other by signal conductors 18 in both the port cards 12 and the switch card 14. The signal conductors 18 in the port cards 12 and the switch card 14 are electrically connected via pin-and-box connectors 20. That is, electrically conductive contact portions 22 on the port cards 12 are placed into electrical contact with electrically conductive contacts 24 within the pin-and-box connectors 20 (see FIG. 1a). The electrically conductive walls 24 are, in turn, electrically connected to signal conductors 18 such that port cards 12 are indirectly electrically connected to switch cards 14. The pin-and-box connectors 20 are typically constructed such that the port cards 12 and switch cards 14 are interconnected in an orthogonal fashion, as shown.

Figure 2:
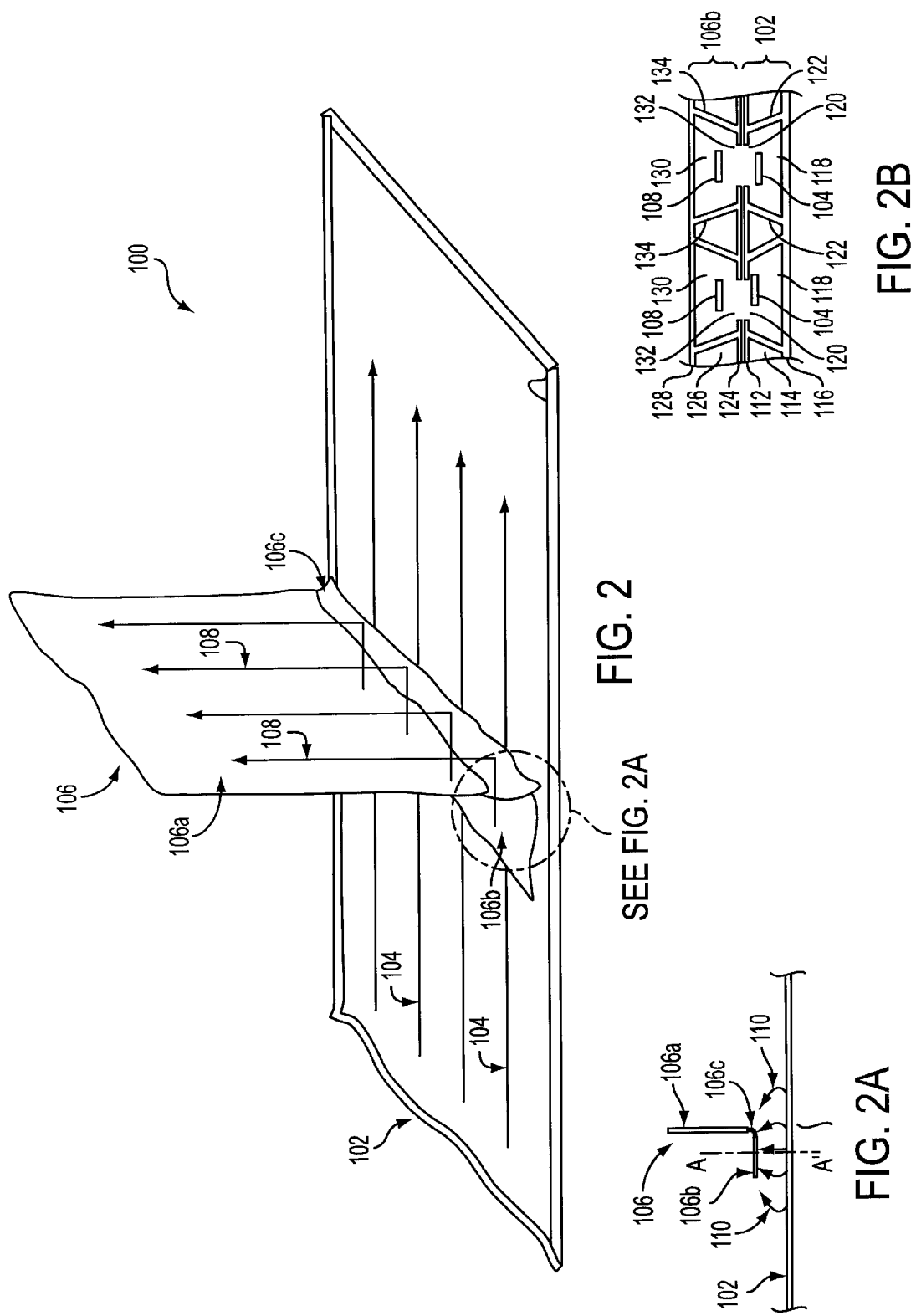
FIG. 2 is a perspective view of a switch card/port card interface configuration in accordance with the present invention.

Referring to FIG. 2, there is shown a switch card/port card interface configuration 100 in accordance with the present invention. The interface configuration 100 comprises a switch card 102 having a plurality of signal conductors 104 formed therein. The interface configuration 100 also comprises a port card 106 also having a plurality of signal conductors 108 formed therein. The port card 106 has an upper rigid portion 106a and a lower rigid portion 106b connected by a middle flexible portion 106c. The signal conductors 108 are formed in and pass through all of these portions 106a, 106b, and 106c, as shown. The middle flexible portion 106c allows the upper rigid portion 106a to be substantially perpendicular to the switch card 102 (as in conventional switch card/port card mounting configurations), while allowing the lower rigid portion 106b to be substantially parallel to the switch card 102. It should be noted that the present invention is not limited in the regard. For example, the port card 106 could be entirely flexible or entirely rigid.

Referring to FIG. 2a, a plurality of electromagnetic field flux lines 110 are shown emanating from the switch card 102 and directed toward the lower rigid portion 106b of the port card 106. The electromagnetic field flux lines 110 are generated by a signal propagating along one of the signal conductors 104 formed in the switch card 102. The electromagnetic field flux lines 110 are received by one of the signal conductors 108 formed in the lower rigid portion 106b of the port card 106, as described in more detail below.

Referring to FIG. 2b, only the top layers of the switch card 102 and the bottom layers of the lower rigid portion 106b of the port card 106 are shown. The switch card 102 comprises a top electrically conductive reference plane layer 112, a signal layer 114, and a buried electrically conductive reference plane layer 116. The signal layer 114 has the signal conductors 104 formed therein. The signal conductors 104 are surrounded by a dielectric material 118. The top reference plane layer 112 has openings 120 formed therein so as to expose at least a portion of the signal conductors 104 in accordance with the present invention. Connecting the top reference plane layer 112 and the buried reference plane layer 116 are a plurality of electrically conductive groove walls 122 which extend along the entire length of the signal conductors 104 within the switch card 102. Thus, each signal conductor 104 is enclosed by a continuous electrically conductive shield, except where the openings 120 are formed in the top reference plane layer 112. These continuous electrically conductive shields are beneficial for reducing or eliminating cross-talk between signals propagating along adjacent signal conductors 104, as described in related U.S. patent application Ser. No. 09/443,128, filed Nov. 18, 1999, which is incorporated by reference herein in its entirety.

At this point it should be noted that the grooves formed by the plurality of electrically conductive groove walls 122 which extend along the entire length of the signal conductors 104 within the switch card 102 are typically filled with a dielectric material.

The lower rigid portion 106b of the port card 106 comprises a bottom electrically conductive reference plane layer 124, a signal layer 126, and a buried electrically conductive reference plane layer 128. The signal layer 126 has the signal conductors 108 formed therein. The signal conductors 108 are surrounded by a dielectric material 130. The bottom reference plane layer 124 has openings 132 formed therein so as to expose at least a portion of the signal conductors 108 in accordance with the present invention. Connecting the bottom reference plane layer 124 and the buried reference plane layer 128 are a plurality of electrically conductive groove walls 134 which extend along the entire length of the signal conductors 108 within the lower rigid portion 106b of the port card 106. Thus, each signal conductor 108 is enclosed by a continuous electrically conductive shield, except where the openings 132 are formed in the bottom reference plane layer 124. These continuous electrically conductive shields are beneficial for reducing or eliminating cross-talk between signals propagating along adjacent signal conductors 108, as described in related U.S. patent application Ser. No. 09/443,128, filed Nov. 18, 1999, which is incorporated by reference herein in its entirety.

The openings 120 formed in the top reference plane layer 112 of the switch card 102 and the openings 132 formed in the bottom reference plane layer 124 of the lower rigid portion 106b of the port card 106 are aligned, as shown, so as to allow an electromagnetic field (e.g., represented by electromagnetic field flux lines 110 in FIG. 2a) generated by a signal propagating along one of the signal conductors 104 formed in the switch card 102 to be received by a corresponding one of the signal conductors 108 formed in the lower rigid portion 106b of the port card 106. The electromagnetic field received at the corresponding one of the signal conductors 108 formed in the lower rigid portion 106b of the port card 106 causes a representative signal to be formed in the corresponding one of the signal conductors 108 formed in the lower rigid portion 106b of the port card 106 by way of electromagnetic coupling. Of course, this technique may be reversed wherein a signal propagating along one of the signal conductors 108 formed in the lower rigid portion is 106b of the port card 106 may cause a representative signal to be formed in a corresponding one of the signal conductors 104 formed in the switch card 102 by way of electromagnetic coupling.

At this point it should be noted that the grooves formed by the plurality of electrically conductive groove walls 134 which extend along the entire length of the signal conductors 108 within the lower rigid portion 106b of the port card 106 are typically filled with a dielectric material.

It should also be noted that signal conductors 104 and 108 are typically 10 mils wide. Also, the signal conductors 104 and 108 are typically spaced 2 to 5 mils from both the top reference plane layer 112 and the buried reference plane layer 116 in the switch card 102, and from both the bottom reference plane layer 124 and the buried reference plane layer 128 in the lower rigid portion 106b of the port card 106, respectively. Further, the signal conductors 104 and 108 are typically spaced 10 mils from the electrically conductive groove walls 122 in the switch card 102, and from the electrically conductive groove walls 134 in the lower rigid portion 106b of the port card 106, respectively. Further still, the electrically conductive groove walls 122 in the switch card 102, and the electrically conductive groove walls 134 in the lower rigid portion 106b of the port card 106, are typically spaced 10 mils apart at the point of their greatest separation (i.e., at the top/bottom reference plane layers).

It should further be noted that at least one high dielectric constant material is preferably deposited between the switch card 102 and the lower rigid portion 106b of the port card 106 in the areas of the openings 120 and 132, respectively, so as to increase the coupling efficiency between the signal conductors 104 and 108. One example of such a high dielectric constant material is barium titanate, $BaTiO_3$. It should be noted, however, that other dielectric material (e.g., with lower dielectric constants) can be used.

Figure 3:
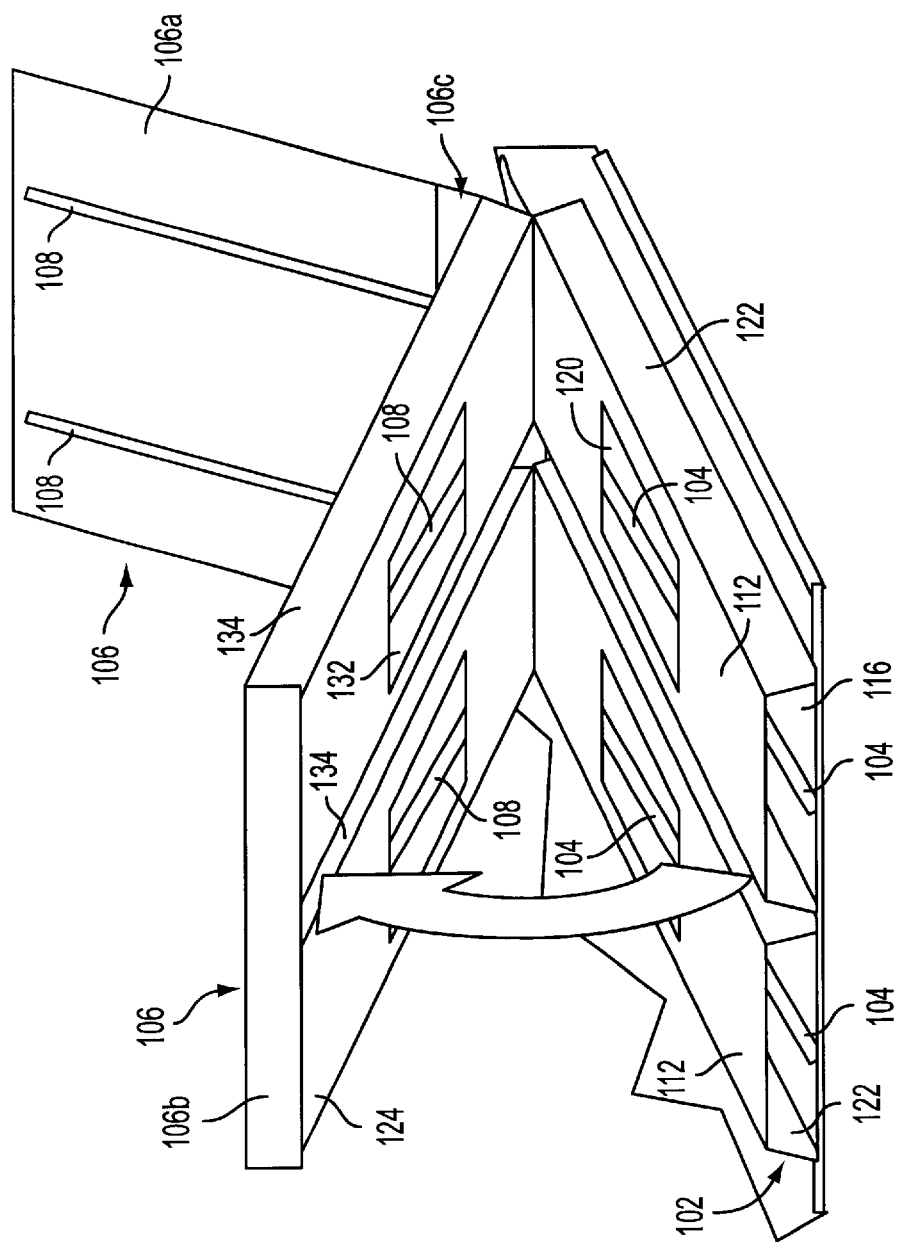
FIG. 3 is a perspective view of the switch card/port card interface configuration shown in FIG. 2 with the entire port card rotated away from the switch card.

Referring to FIG. 3, the switch card/port card interface configuration 100 is shown with the entire port card 106 rotated away from the switch card 102 so as to provide a better understanding of the present invention. Also, dielectric materials 118 and 130 have been removed so as to provide a clearer picture of the internal layers of both the switch card 102 and the port card 106, respectively. Further, a portion of the top reference plane layer 112 of the switch card 102 above the electrically conductive groove walls 122, and a portion of the bottom reference plane layer 124 of the lower rigid portion 106b of the port card 106 below the electrically conductive groove walls 134 have been removed so as to provide a clearer picture of the electrically conductive groove walls 122 and the electrically conductive groove walls 134, respectively.

Figure 4:
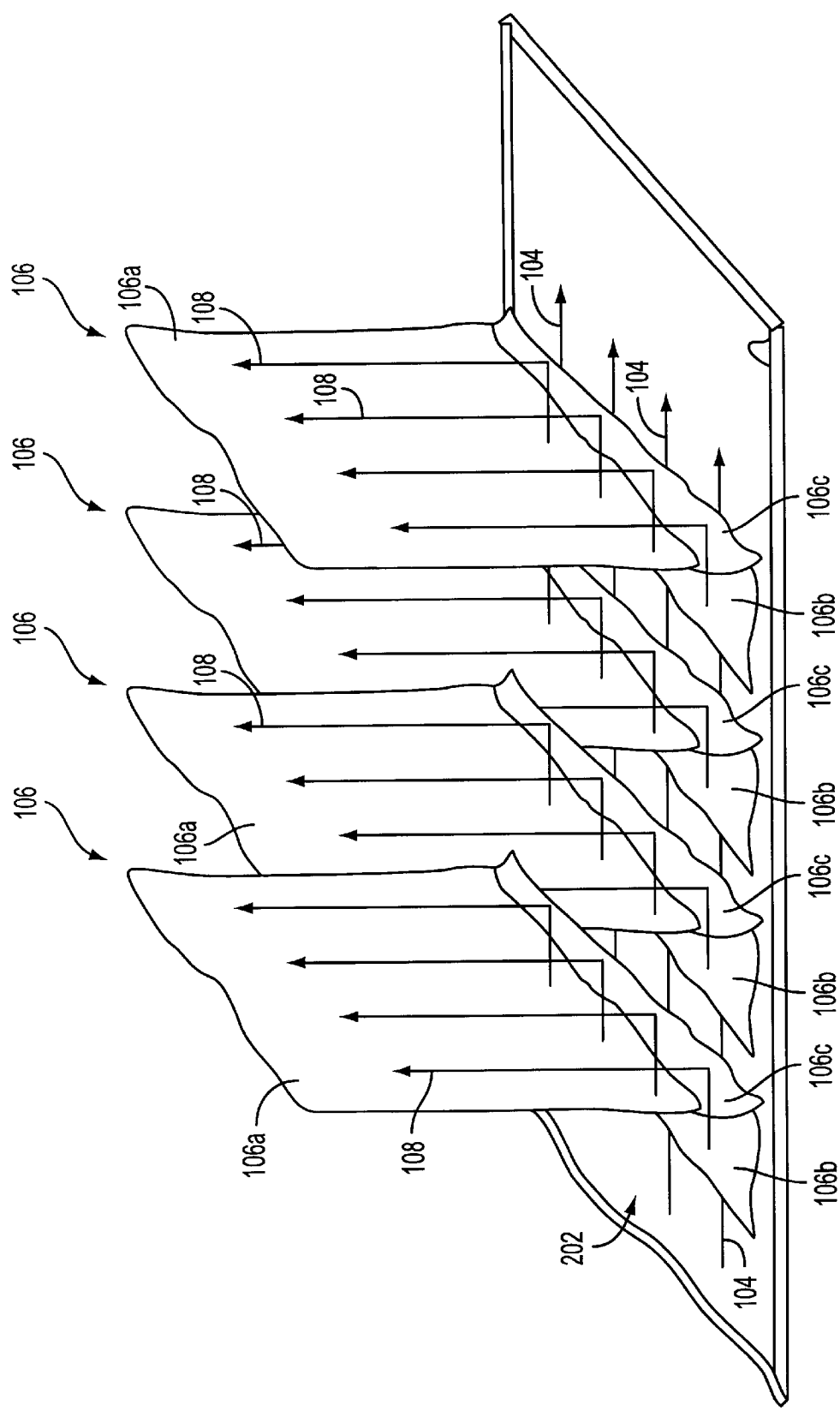
FIG. 4 is a perspective view of a second embodiment of a switch card/port card interface configuration in accordance with the present invention.

Referring to FIG. 4, there is shown a second embodiment of a switch card/port card interface configuration 200 in accordance with the present invention wherein a plurality of port cards 106 are shown interfacing with a single-sided switch card 202. All of the port cards 106 interface with the single-sided switch card 202 in accordance with the present invention in the manner described above.

Figure 5:
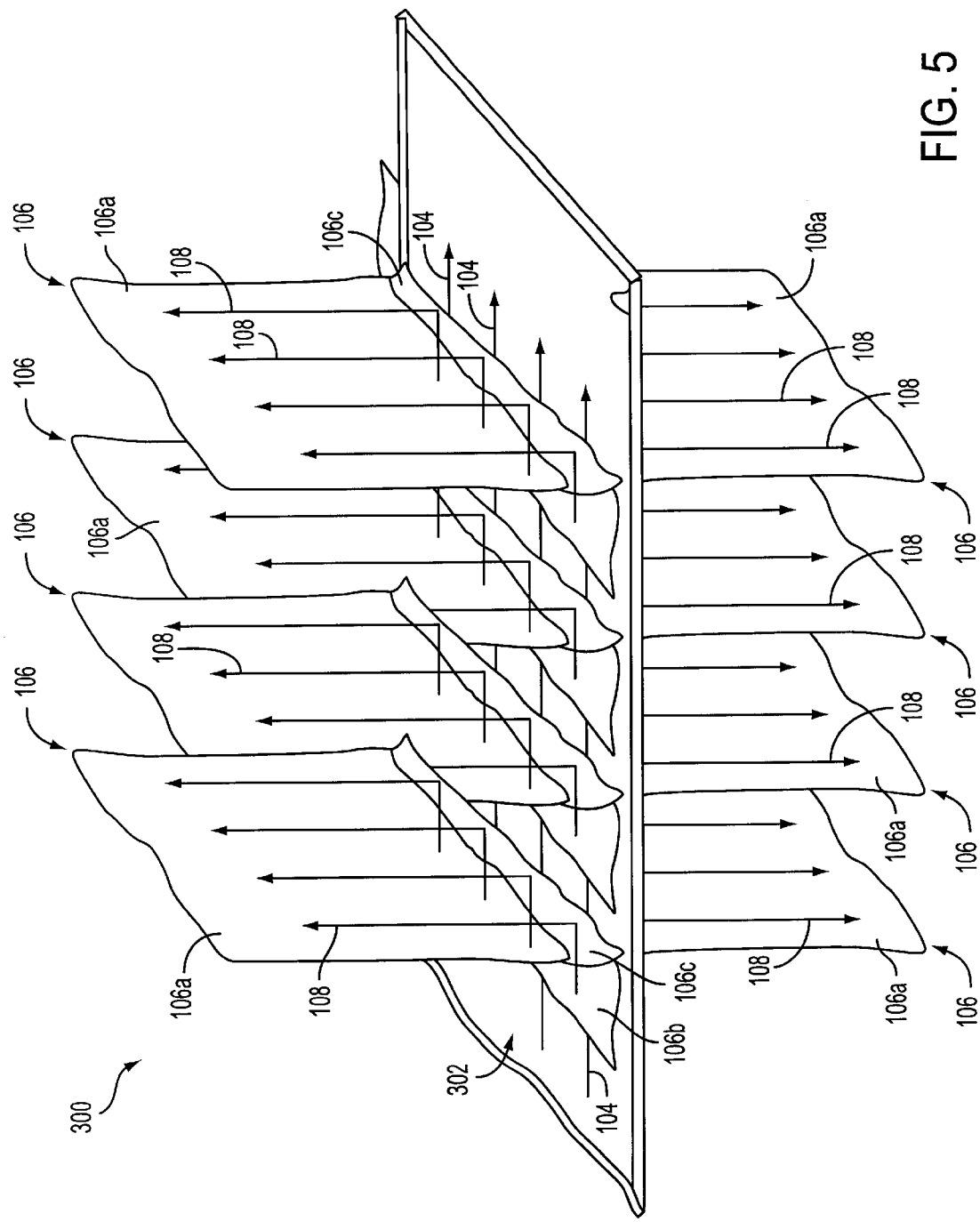
FIG. 5 is a perspective view of a third embodiment of a switch card/port card interface configuration in accordance with the present invention.

Referring to FIG. 5, there is shown a third embodiment of a switch card/port card interface configuration 300 in accordance with the present invention wherein a plurality of port cards 106 are shown interfacing with a double-sided switch card 302. All of the port cards 106 interface with the double-sided switch card 302 in accordance with the present invention in the manner described above.

At this point it should be noted that in all of the above-described embodiments only one of the signal conductors may have a shield with an opening and the circuit boards may be positioned such that the signal conductors are aligned through the opening and a signal propagating along a first signal conductor in a first circuit board is coupled to a second signal conductor in a second circuit board.

Referring to FIG. 6, there is shown a fourth embodiment of a switch card/port card interface configuration 400 in accordance with the present invention wherein a plurality of port cards 401 are shown directly connected to a plurality of switch cards 402. In this embodiment, the switch cards and port cards interconnect in a substantially orthogonal relationship without the need of a third circuit board, or midplane, as required by the prior art shown in FIG. 1. As shown, all of the switch cards 402 comprise a substantially rigid portion 403 having a plurality of circuit layers (not shown), an interconnection portion 404 for directly mating the particular switch card to an adjacent port card, and a flexible portion 406 for connecting the rigid and interconnection portions. Preferably, flexible portion 406 has sufficiently less circuit layers than the adjacent rigid portion such that each interconnection portion 404 may freely rotate about the rigid portion 403, as shown in FIGS. 7 and 7a. Further, each switch card includes a signal conductor 405 that is formed and passes through its rigid, interconnection, and flexible portions.

FIGS. 7 and 7a illustrate alternate views of a switch card 402 and more specifically illustrate the flexibility of flexible portions 406. As indicated by the arrows, each flexible portion 406 is able to rotate about rigid portion 403 as a result of having less circuit layers. This feature is essential to the invention and allows the desired orthogonal interconnection shown in FIG. 7a without the use of a midplane. Preferably, the flexible portion 406 comprises a rigid-flex substrate. It should be note that interconnection portions 404 may also comprise a rigid-flex substrate. Also, it should be noted that the interconnection between the switch and port cards need not be orthogonal; that is, the two cards may be interconnected at any angle substantially between 0 and 180 degrees, if desired.

The invention contemplates various means for interconnecting the switch card to a port card, and vice-versa. FIG. 6a, for example, illustrates a direct electrical connection that is accomplished by a male connector 408 connected to the interconnection portion 404 of the switch card, and a female connector 409 connected to the port card for receiving the male connector. In this instance, the interconnection portion 404, and more specifically the female connector 409, is positioned in a substantially perpendicular position relative to rigid portion 403. The male connector of the switch card is then inserted into the female connector of the port card and is subsequently held firmly in place through mechanical means such as soldering, bracing, and/or clamping. Alternatively, the male connector can be associated with the port card and the female connector with the switch card.

Yet another means for interconnecting the switch and port cards is through electromagnetic means. In this instance, shown in detail in FIGS. 8 and 8a, the interconnection portion 404 is attached to a corresponding port card 401 in manner described above and illustrated in FIGS. 2a, 2b, and 3.

Figure 9:
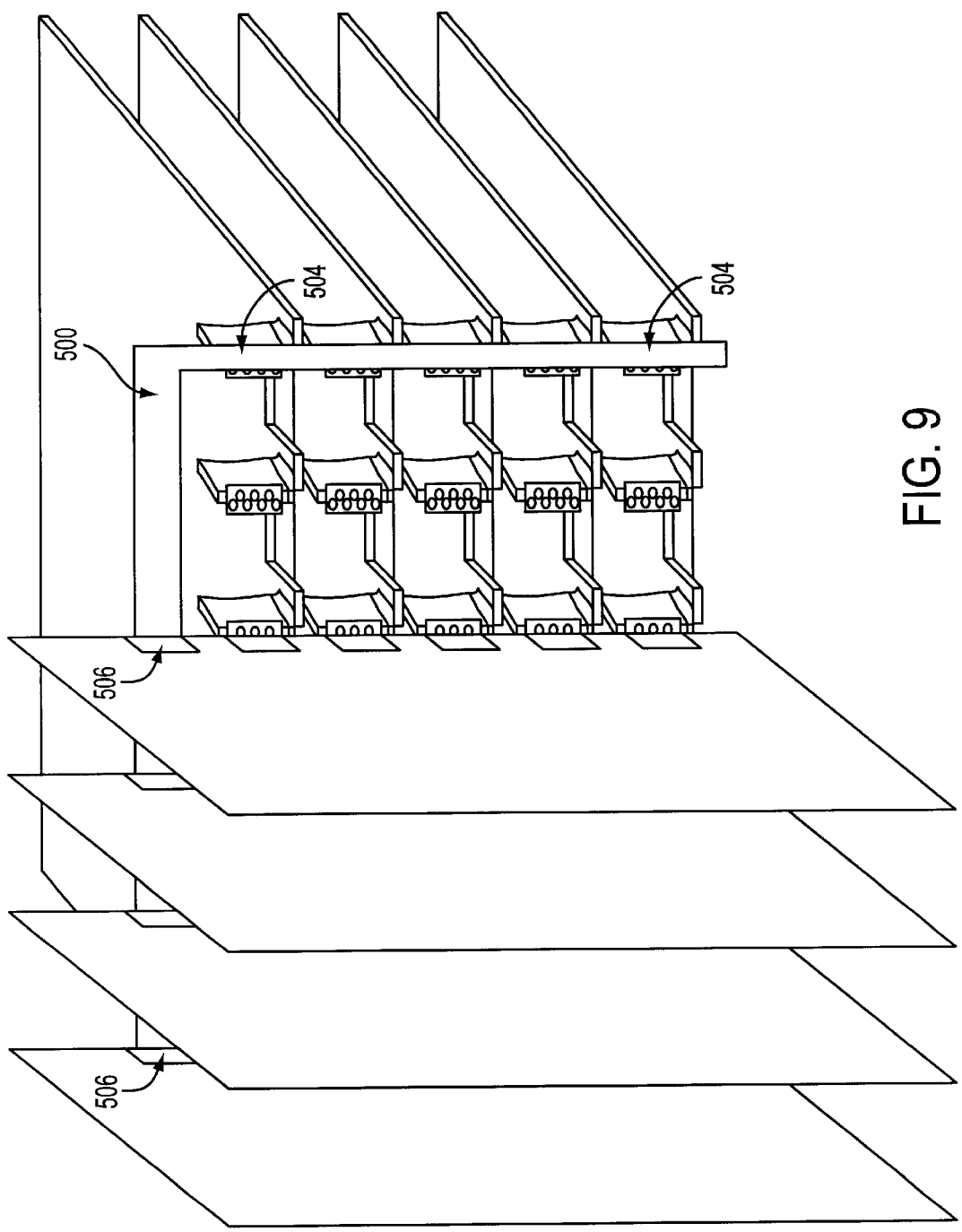
FIG. 9 is a perspective view of a sixth embodiment of a switch card/port card interface configuration in accordance with the present invention.

FIG. 9 illustrates a switch card/port card interface configuration in accordance with the present invention wherein a plurality of interconnected switch and port cards are shown comprising a power bus 500. As shown, the power bus comprises select power connector portions 504 and 506 allocated for the purpose of providing requisite electrical energy to the various switch and port cards. The means for connecting the boards are the same direct electrical connection means and electro-magnetic connection means described above.

In view of the foregoing, it is apparent that the present invention provides a technique for coupling signals between circuit boards wherein the need for conventional mechanical connectors is totally eliminated. The elimination of conventional mechanical connectors results in the elimination of parasitics that are typically associated with conventional mechanical connectors, thereby resulting in better signal integrity. Also, there are no longer any costs for purchasing connectors, as well as no assembly costs for mounting the connectors on a switch card. Further, by incorporating the shielding concept described in related U.S. patent application Ser. No. 09/443,128, filed Nov. 18, 1999, which is incorporated by reference herein in its entirety, there is minimal or no unwanted signal cross-talk. Thus, the present invention is particularly beneficial for high speed signal applications.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can is be beneficially implemented in any number of environments for any number of purposes. Accordingly, the claims set forth below should be construed in view of the full breath and spirit of the present invention as disclosed herein.

What is claimed is:

1. An improved electrical interconnection between a first circuit board and a second circuit board, the first circuit board having a substantially rigid circuit portion including a first signal layer, the first circuit board also having a first interconnection portion including the first signal layer, the second circuit board having a second interconnection portion for mating with the first interconnection portion, the improvement comprising:

a flexible portion, including the first signal layer, formed in the first circuit board for connecting the substantially rigid circuit portion to the first interconnection portion, the flexible portion allowing the first interconnection portion to be oriented substantially perpendicular to the substantially rigid circuit portion such that a mating of the first interconnection portion with the second interconnection portion results in a substantially orthogonal electrical interconnection arrangement between the substantially rigid circuit portion of the first circuit board and the second circuit board.

2. The improved electrical interconnection between a first circuit board and a second circuit board of claim 1, wherein the first interconnection portion is flexible.

3. The improved electrical interconnection between a first circuit board and a second circuit board of claim 1, wherein the first interconnection portion is rigid.

4. The improved electrical interconnection between a first circuit board and a second circuit board of claim 1, wherein mating is accomplished through a direct electrical connection between the first and second circuit boards.

5. The improved electrical interconnection between a first circuit board and a second circuit board of claim 4, wherein the direct electrical connection is accomplished by a male connector connected to the first interconnection portion and a female connector connected to the second interconnection portion for receiving the male connector.

6. The improved electrical interconnection between a first circuit board and a second circuit board of claim 4, wherein the direct electrical connection is accomplished by a female connector connected to the first interconnection portion for receiving a male connector connected to the second interconnection portion.

7. The improved electrical interconnection between a first circuit board and a second circuit board of claim 1, wherein the mating between the first and second circuit boards is accomplished through electromagnetic coupling.

8. The improved electrical interconnection between a first circuit board and a second circuit board of claim 7, wherein the first interconnection portion further comprises an electrically conductive shield for shielding the first signal layer, the first electrically conductive shield having a first opening formed therein so as to expose the first signal layer, the electromagnetic coupling comprises aligning the first opening with the second interconnection portion.

9. The improved electrical interconnection between a first circuit board and a second circuit board of claim 8, further comprising at least one dielectric constant material disposed between the first interconnection portion and the second circuit board in the area where the first opening is aligned with the second interconnection portion.

10. The improved electrical interconnection between a first circuit board and a second circuit board of claim 1, wherein the first and second circuit boards further comprise respective first and second power connector portions which connect to form a power bus.

11. The improved electrical interconnection between a first circuit board and a second circuit board of claim 10, wherein the first and second power connector portions are connected through a direct electrical connection.

12. The improved electrical interconnection between a first circuit board and a second circuit board of claim 11, wherein the direct electrical connection is accomplished by a male connector connected to the first interconnection portion and a female connector connected to the second interconnection portion for receiving the male connector.

13. The improved electrical interconnection between a first circuit board and a second circuit board of claim 11, wherein the direct electrical connection is accomplished by a female connector connected to the first interconnection portion for receiving a male connector connected to the second interconnection portion.

14. The improved electrical interconnection between a first circuit board and a second circuit board of claim 11, wherein the first and second power connector portions are connected through electro-magnetic coupling.

15. The improved electrical interconnection between a first circuit board and a second circuit board of claim 1, wherein the first circuit board is a switch card and the second board is a port card.

16. A method for electrically interconnecting a first circuit board to a second circuit board, the first circuit board having a substantially rigid circuit portion including a first signal layer, the first circuit board also having a first interconnection portion including the first signal layer, the second circuit board having a second interconnection portion for mating with the first interconnection portion, the improvement comprising;

forming a flexible portion, including the first signal layer, in the first circuit board for connecting the substantially rigid circuit portion to the first interconnection portion, the flexible portion allowing the first interconnection portion to be orientated substantially perpendicular to the substantially rigid circuit portion such that a mating of the first interconnection portion with the second interconnection portion results in a substantially orthogonal electrical interconnection arrangement between the substantially rigid circuit portion of the first circuit board and the second circuit board.

17. The method of claim 16, wherein the method of claim 16 further comprises the step of positioning the first interconnection portion in a position substantially perpendicular to the rigid portion.

18. The method of claim 16, wherein mating comprises inserting a male connector connected to the first interconnection portion into a female connector connected to the second interconnection portion.

19. The method of claim 16, wherein mating comprises inserting a male connector connected to the second interconnection portion into a female connector connected to the first interconnection portion.

20. The method of claim 16, wherein the first interconnection portion further comprises an electrically conductive shield for shielding the signal layer, the first electrically conductive shield having a first opening formed therein so as to expose the signal layer, further comprising the step of aligning the first opening with the second interconnection portion.

21. The method of claim 20 further comprising the step of:

placing at least one dielectric constant material between the first interconnection portion and the second circuit board in the area where the first opening is aligned with the second interconnection portion.

22. The method of claim 16, wherein the first circuit board is a switch card and the second circuit board is a port card.

* * * * *